United States Patent [19]

Hansen

[11] 4,142,151

[45] Feb. 27, 1979

[54] FAILED DIODE INDICATOR

[75] Inventor: Wilbur O. Hansen, Erie, Pa.

[73] Assignee: General Electric Company, Erie, Pa.

[21] Appl. No.: 818,483

[22] Filed: Jul. 25, 1977

[51] Int. Cl.$^2$ ............................................. G01R 31/02
[52] U.S. Cl. ................................. 324/158 D; 73/356; 116/216; 324/51; 340/645
[58] Field of Search ...................... 324/51, 158 D, 133; 340/248 A, 248 E, 253 A, 253 E, 253 H, 253 N; 116/114 V, 114 Y, 114.5; 73/356, 358

[56] References Cited

U.S. PATENT DOCUMENTS

| 2,550,119 | 4/1951 | Marbury et al. | 340/248 E |
| 2,673,325 | 3/1954 | Orr | 324/32 |
| 3,052,840 | 9/1962 | Michaelis | 324/158 D |
| 3,200,392 | 8/1965 | Chumakov | 324/158 D |
| 3,305,773 | 2/1967 | Beaty | 324/51 |
| 3,396,335 | 8/1968 | Burr et al. | 324/51 |
| 3,718,920 | 2/1973 | Grenier | 340/248 E |
| 4,017,795 | 4/1977 | Milligan | 324/110 |
| 4,053,876 | 10/1977 | Taylor | 340/253 H |

Primary Examiner—Gerard R. Strecker
Attorney, Agent, or Firm—Albert S. Richardson, Jr.

[57] ABSTRACT

A shorted diode in an array of parallel diodes is detected by connecting between normally equipotential points in each pair of adjacent branch circuits of the array an inexpensive indicating device comprising signaling means for visually indicating that a malfunction has occurred if appreciable current flows in an associated resistor. The signaling means comprises heat sensitive material that changes appearance when its temperature is raised to a predetermined high degree by the heat generated in the resistor when current flows between the aforesaid connection points due to the potential difference that develops therebetween as a result of a diode failing shorted.

10 Claims, 5 Drawing Figures

FAILED DIODE INDICATOR

BACKGROUND OF THE INVENTION

This invention relates to electrical protective apparatus and, more particularly, to means for visually indicating a malfunction in an electric power rectifier bridge whose separate legs are formed of parallel arrays of semiconductor power rectifier cells.

A power rectifier cell is physically characterized by a body of semiconductor material (usually silicon) sealed in an insulating enclosure or housing between a pair of main current-carrying metallic electrodes (anode and cathode, respectively). The semiconductor body comprises, for example, a thin, broad area disc-like wafer having adjoining layers of different conductivity types (P and N, respectively), whereby a PN (rectifying) junction is formed between the main electrodes. Such a device is often referred to as an uncontrolled rectifier or simply a diode. When electrically connected in series with a load impedance and an external power circuit, including a source of alternating voltage, a diode will ordinarily block the flow of load current so long as the potential of its anode is negative with respect to the cathode (i.e., reverse biased) but will freely conduct load current if the anode potential is relatively positive by at least a predetermined small threshold (i.e., forward biased).

The forward current and peak blocking voltage ratings of a diode are specified by the manufacturer. These ratings determine the maximum load current that the diode can conduct in the forward direction and the maximum applied voltage that it can safely withstand in the reverse direction. By way of example, power diodes having a maximum continuous RMS forward current rating of 250 amperes and a peak reverse voltage of 1,200 volts at an operating junction temperature of 160° C. are commercially available today.

Such diodes are used to rectify current in many high power applications. One such application is in the art of diesel electric locomotives where three-phase rectifier bridge are used to supply direct current (d-c) to traction motor loads from the three-phase alternating current (a-c) output of diesel engine-driven alternators. Each leg of such a rectifier bridge must be capable of carrying as much as 1,500 amperes in the forward direction, thereby requiring the paralleling of diodes. Thus the basic building block of the rectifier bridge is a parallel array of discrete diodes, all poled in agreement with one another. It is customary to provide either electric current limiting fuses or extra diodes in series with the respective paralleled diodes so that the equipment can remain operative if one of the diodes were to fail shorted, a condition wherein the failed diode looses its ability to block current when reverse biased. Where extra diodes are provided, all of the diodes are usually shunted by duplicate capacitors appropriately sized to promote the substantially equal division, among the seriesed diodes, of the reverse voltage that is periodically applied across each leg of the bridge. These capacitors also provide desirable snubber action.

When properly protected by current limiting fuses or extra series diodes, the occasional shorting of a weak or improperly installed diode will not cause a catastrophic short circuit between the a-c and d-c terminals of the rectifier bridge, and the remaining sound diodes usually perform adequately at least for a while. However, the safety factor has been reduced, and some of the remaining diodes will now experience higher electrical stress than normally intended and may soon fail, whereupon a serious line-to-line fault can occur with resulting damage to the rectifier bridge or to the a-c source. It is desirable, therefore, to routinely check for an insipient failure of the rectifier bridge before such damage actually occurs. Heretofore this has been done by continuity checks of all of the diodes at routing maintenance intervals, a time consuming and painstaking task at best, or by individually monitoring the diodes with relatively expensive indicating fuses or lamps.

SUMMARY OF THE INVENTION

It is a general objective of this invention to provide a simple, inexpensive, and convenient means for the early warning of a malfunction in an electric power rectifier bridge comprising a plurality of arrays of parallel diodes.

Another objective of the invention is to provide improved means for quickly and conveniently observing, during routine inspections, an insipient failure condition of such a rectifier bridge without requiring that the bridge be energized or that any external equipment or power source be used.

In carrying out the invention in one form, I provide an indicating device that includes electroconductive means adapted to conduct electric current between a pair of spaced apart terminals and that also includes signaling means responsive to current being conducted by the electroconductive means for visually signaling that such an event has taken place. One terminal of the indicating device is connected to a first point intermediate a pair of diodes that are serially interconnected in a first branch circuit, and the other terminal is connected to a second point intermediate another pair of diodes that are serially interconnected in a second branch circuit. The first and second branch circuits are connected in parallel relationship with one another to form an electric power network that is part of a power rectifier bridge connected between a source of alternating voltage and a d-c load, and the aforesaid second intermediate point normally has the same potential as the first intermediate point. Consequently during normal balanced conditions there is negligible current in the electroconductive means of the indicating device, but upon the failure of any one of the diodes in a shorted mode the resulting potential difference between the intermediate points will cause the electroconductive means to conduct sufficient current to actuate its associated signaling means. Preferably the electroconductive means of the indicating device is a resistive element of relatively high ohmic value resistor, and the signaling means simply comprises heat sensitive material attached to the exterior of the resistor where its appearance noticeably and permanently changes in response to the elevation of temperature that occurs as a result of heat generated in the resistive element when conducting an appreciable amount of current.

The invention will be better understood and its various objects and advantages will be more fully appreciated from the following description taken in conjunction with the accompanying drawing.

DESCRIPTION OF THE PREFERRED EMBODIMENT

Figure 1:
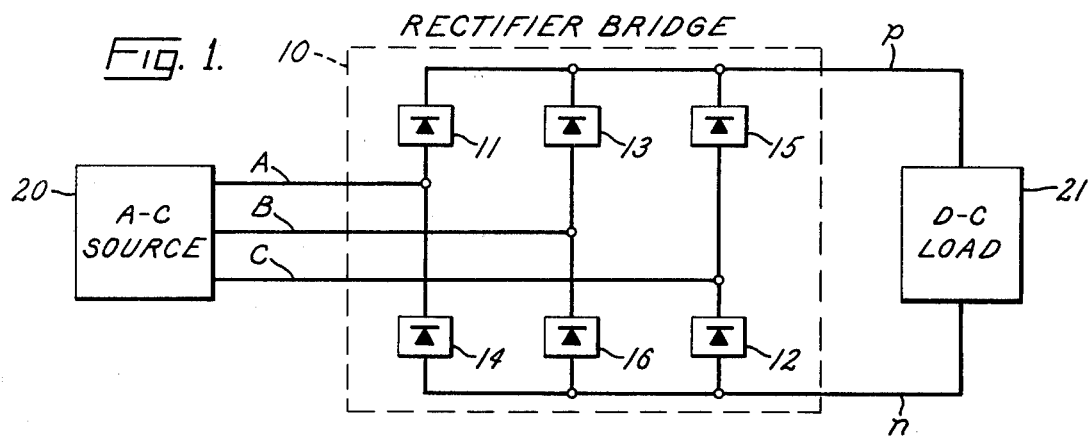
FIG. 1 is a functional block diagram illustrating an electric power system wherein a d-c load circuit is connected to a source of alternating voltage by way of a rectifier bridge.

Referring now to FIG. 1, there is shown an electric power rectifier bridge 10 having six legs 11, 12, 13, 14, 15, and 16 connected between a source 20 of a-c electric power and a d-c load 21. The legs of this bridge are arranged in a typical three-phase double-way configuration having a set of three a-c terminals that are connected for energization, by way of supply lines A, B, and C, respectively, to different phases of a three-phase alternating current output of the source 20, and having a pair of d-c terminals connected in turn, by way of d-c load current conductors p and n, to the input of the electric load 21. Persons skilled in the art will appreciate that my invention is not limited to this particular arrangement of rectifier legs and is useful as well in other known single or polyphase power rectifier configurations.

Figure 2:
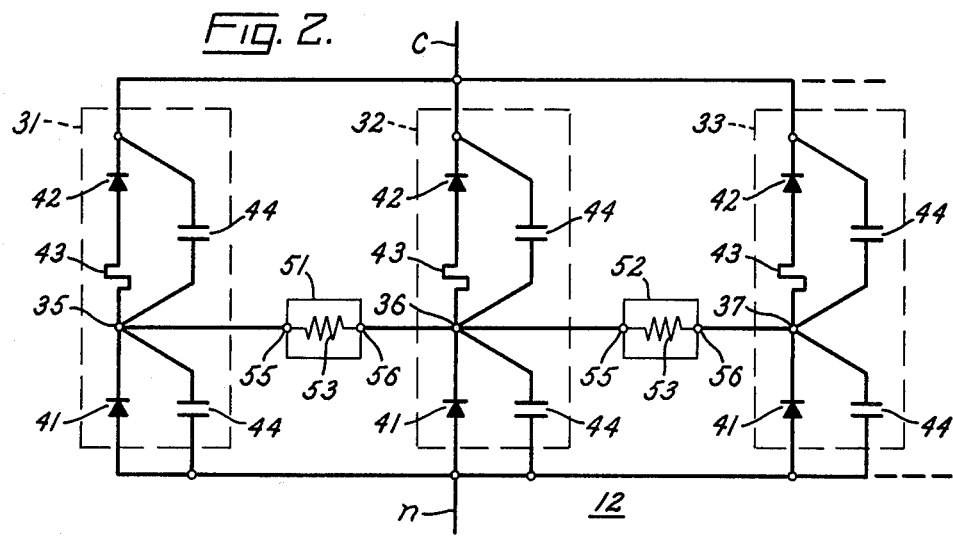
FIG. 2 is a schematic circuit diagram of a network formed of parallel arrays of serially interconnected diodes that can be used as one of the legs of the rectifier bridge shown in FIG. 1 and that illustrates a practical environment for the present invention.

FIG. 2 illustrates an electric power network that is intended to serve as one of the rectifier legs shown in block form in FIG. 1. Leg 12 has been selected by way of example, it being understood that legs 14 and 16 are duplicates of leg 12 while legs 11, 13, and 15 are the same except for inverted polarity. The illustrated network includes first, second, and third branch circuits 31, 32, and 33 connected in parallel relationship with one another between the a-c supply line C and the d-c conductor n, whereby the forward current rating of the network is approximately three times greater than the safe current capability of any one of its individual branch circuits. To further increase the current rating, more branch circuits can be added in parallel with those shown if desired.

Each of the branch circuits 31, 32, and 33 of the network 12 comprises a first discrete semiconductor power rectifier cell or diode 41 serially interconnected with a second duplicate cell or diode 42 in polarity agreement therewith, whereby the maximum reverse voltage rating of the network is approximately two times greater than the safe reverse voltage capability of a single diode. As shown the anode of the diode 41 is connected directly to the relatively negative d-c load current conductor n, the cathode of diode 42 is connected directly to the a-c supply line C, and the cathode of diode 41 is coupled to the anode of diode 42 via an optional current sharing resistor 43 of relatively low ohmic value, (e.g. 0.004 ohms) that promotes substantially equal division of forward current among the paralleled strings 31, 32, 33 of seriesed diodes. If a higher reverse voltage were desired, at least one additional diode could be connected in series with the second diode 42 between its cathode and the line C. To assure equal division of any reverse voltage impressed across the two diodes 41 and 42 in series and to provide desirable snubber action, the diodes are respectively shunted by duplicate capacitors 44 of suitable size (e.g., 1.0 microfarads).

In accordance with the present invention, the failure of a capacitor 44 (open circuit or shunt circuit) or the shorting of a diode 41 or 42 in the network 12 can be visually detected by observing the state of suitable indicating devices 51 and 52 connected between normally equipotential points intermediate the two diodes of adjacent pairs of branch circuits. Each of these indicating devices comprises electroconductive means 53 adapted to conduct current between a pair of spaced apart terminals 55 and 56 and having associated therewith signaling means for visually indicating that current has been conducted by the electroconductive means 53. The signaling means is in the form of heat sensitive material disposed in the vicinity of the electroconductive means 53 and characterized by a noticeable change in appearance whenever it is heated to at least a predetermined high temperature. The electroconductive means 53 of the indicating device comprises a low wattage resistive element of relatively high ohmic value, and the heat generated in such an element when conducting an appreciable amount of current (e.g., 6 milliamperes) will elevate the temperature in its proximity sufficiently to actuate the heat sensitive material and cause it permanently to change appearance (e.g., from white to black).

Figure 3:
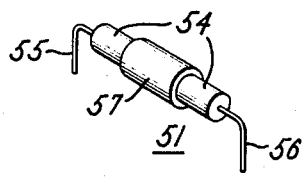
FIG. 3 is a simplified isometric view of an indicating device used in practicing my invention in its preferred form.

FIG. 3 illustrates the presently preferred embodiment of the indicating device 51. It comprises a standard film type resistor having a cylindrical body 54 of insulating material and a pair of axial leads or terminals 55 and 56 of conducting material at opposite ends of the body 54. Spanning the leads 55 and 56 on a ceramic core inside the body 54 is a film of tin oxide that serves as the resistive element 53 (not shown in FIG. 3). Attached to the exterior of the body 54 is the above-mentioned heat sensitive material, preferably in the form of a strip of adhesive-backed wax coated paper 57 that is wrapped around the middle of the body 54. A commercially available material suitable for this purpose is known as "Thermopaper" and is sold by Paper Thermometer Company, Inc., 10 Stagg Drive, Natick, Mass. 01760. The wax on this paper has a very stable predetermined melting point, and when heated to a temperature equal to or hotter than its specified melting point the wax melts and the exposed surface of the strip 57 irreversibly changes color from white to black. The color changing (actuating) temperature of the material 57 on the exterior of the device 51 and the ohmic value of the resistive element of this device are appropriately chosen, in conjunction with the known voltage levels and ambient temperature of the system in which the device is used, so that the actuating temperature is not reached under normal operating conditions but only when a diode or a capacitor fails. For example, in one practical application of my invention a one watt resistor of 47,000 ohms was successfully used to heat a strip of Thermopaper to its chosen actuating temperature of 121°C. upon the shorting of one diode. While not shown in FIG. 3, the indicating device 51 preferably includes a transparent cover or coating that will protect the heat sensitive material 57 from mechanical and chemical damage.

As can be seen in FIG. 2, the terminal 55 of the indicating device 51 is connected to a point 35 intermediate the first and second diodes 41 and 42 of the first branch circuit 31, and the terminal 56 of this device is connected to a point 36 intermediate the first and second diodes 41 and 42 of the second branch circuit 32 of the network 12. During normal balanced conditions, the potential of point 35 is always approximately equal to the potential of point 36, and there is negligible current in the element 53 of the indicating device 51. Consequently the surface temperature of the indicating device is the same as ambient temperature, and the heat sensitive material 57 remains white. If, however, any one of the diodes in the two branch circuits 31 and 32 fails in a shorted mode, or if one of the associated capacitors 44 fails, the voltage division in the affected branch circuit will deviate from that in companion branch circuit and an appreciable potential difference (e.g., 300 volts) will develop between the intermediate points 35 and 36 during periods when reverse voltage is applied across the network (diode blocking intervals). This high potential difference will cause the element 53 of the indicating device 51 to conduct sufficient current to actuate the associated signaling means, as by elevating the surface temperature of the body 54 to a degree that causes the external material 57 to change in appearance from white to black.

The indicating device 52 is similarly connected between the intermediate point 36 of the second branch circuit 32 and a point 37 intermediate the first and second diodes 41 and 42 of the third branch circuit 33 of the network 12 shown in FIG. 2, whereby the signaling means of this device is actuated upon failure of any one of the diodes or capacitors in either of the branch circuits 32 and 33. Preferably the indicating devices 51 and 52 are disposed in close physical proximity to the pairs of branch circuits between which they are respectively connected, thereby providing a visual clue as to which diodes should be inspected when a blackened indicating device is observed. At the next convenient opportunity following observation of a blackened indicating device, the rectifier bridge should be deenergized and all diodes and capacitors in both of the adjacent branch circuits should be checked. Any failed component can then be replaced with a new one, and the actuated indicating device should likewise be replaced.

Figure 4:
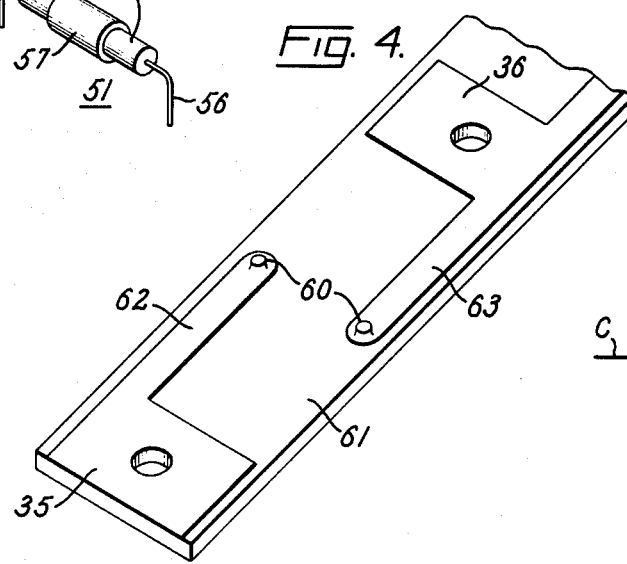
FIG. 4 is an isometric view of the preferred mounting and connection means for the FIG. 3 indicating device in the FIG. 2 rectifier leg.

For ease in removing and replacing a blackened indicating device, it is preferably connected to the associated intermediate points by means of receptacles that detachably receive the respective terminals 55 and 56 of the device. FIG. 4 shows at 60 such receptacles designed for receiving the axial leads of the FIG. 3 embodiment of the indicating device 51. They are conventional jacks mounted on an epoxy glass printed circuit board 61 in spaced part relationship so as detachably to receive the leads of the device 51. One of the receptacles 60 is connected to the intermediate point or junction 35 by way of a copper run 62 deposited on the board 61, and the other receptacle is connected by way of a copper run 63 to the intermediate point or junction 36. In FIG. 4 the two junctions 35 and 36 are shown as relatively large conducting areas on the surface of the printed circuit board 61 having bolt holes for attaching the terminals of the associated components of the branch circuits 31 and 32 of the network 12. The board 61 is intended to be physically supported by a suitable insulating structure that also supports the heat sinks of the respective diodes 41 and 42 and all of the other power and auxiliary components of the network 12.

DESCRIPTION OF AN ALTERNATIVE EMBODIMENT

Figure 5:
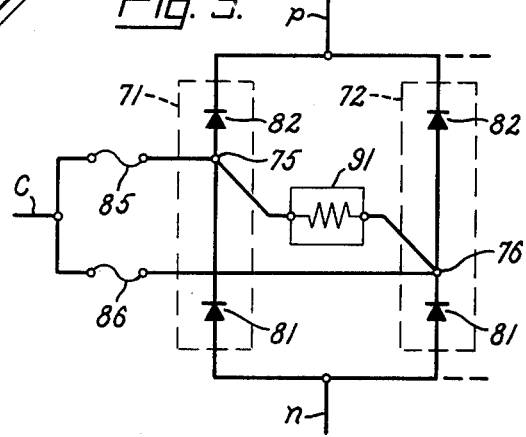
FIG. 5 is a schematic circuit diagram of another network of paralleled/seriesed diodes that can be used as a pair of complementary legs of the rectifier bridge shown in FIG. 1 and that illustrates an alternative environment for my invention.

FIG. 5 illustrates another electric power network of paralleled/seriesed diodes incorporating my malfunction indicator to signal the shorting of any one of the diodes. This network is intended to serve as a complementary pair of the rectifier legs shown in block form in FIG. 1. Legs 15 and 12 have been selected by way of example.

The network shown in FIG. 5 has two branch circuits 71 and 72 connected in parallel relationship with one another between the d-c conductors p and n. For higher current ratings more parallel branch circuits can be added if desired. Each of the branch circuits 71 and 72 comprises two semiconductor power rectifier cells or diodes 81 and 82 serially interconnected in polarity agreement. These diodes can have higher peak reverse voltage ratings than the diodes 41 and 42 used in the FIG. 2 network. The juncture 75 of the two diodes 81 and 82 in the branch circuit 71 is connected through a current limiting fuse 85 to the a-c supply line C, and the juncture 76 of the two diodes 81 and 82 in the second branch circuit 72 is connected through a duplicate current limiting fuse 86 to the same a-c supply line C, whereby both of the junctures or points 75 and 76 normally have the same potential as line C. The fuses 85 and 86 are provided to protect the a-c source from damage in the event either of the diodes in the associated branch circuit were to fail in a shorted mode.

As soon as a diode in the FIG. 5 network fails shorted, the associated fuse 85 or 86 will open, thereby disconnecting the affected branch circuit from the a-c supply line C. As a result, an appreciable potential difference will develop between the intermediate points 75 and 76 of the two branch circuits 71 and 72 during periods when the failed diode was intended to withstand reverse voltage. In accordance with my invention, such a malfunction is indicated by connecting an indicating device 91 between the points 71 and 72. Preferably the device 91 is the same in construction and operation as the previously described indicating device 51, except that its resistive element can have an even higher ohmic value (e.g., 200,000 ohms).

While I have illustrated a preferred form of my invention and suggested certain variations therein, other modifications and variations will probably occur to persons skilled in the art. It is therefore intended by the concluding claims to cover all such changes as fall within the true spirit and scope of this invention.

What I claim as new and desire to secure by Letters Patent of the United States is:

1. In a malfunction indicator for an electric power network connected between a source of alternating voltage and a d-c load, said network having at least two branch circuits connected in parallel relationship with one another, each of said branch circuits comprising at least first and second semiconductor power rectifier cells serially interconnected in polarity agreement, the improvement comprising:
   a. a resistor comprising a cylindrical body, terminals at opposite ends of said body, and a resistive element of relatively high ohmic value connected between said terminals;
   b. connecting means for connecting the terminals of said resistor to normally equipotential points intermediate said first and second cells of the respective branch circuits, whereby during normal balanced conditions there is negligible electric current in said resistive element; and c. heat sensitive material attached to the exterior of said cylindrical body for visually indicating that current has been conducted by said resistive element, said material being characterized by a noticeable and irreversible change in appearance whenever it is heated to a predetermined high temperature by heat generated in said resistive element when conducting current in response to an appreciable potential difference between said intermediate points of the two branch circuits as a result of the failure of any one of said cells in a shorted mode.

2. The malfunction indicator of claim 1 wherein said predetermined high temperature is approximately 120° C.

3. The malfunction indicator of claim 1 wherein said heat sensitive material comprises wax coated paper that noticeably changes in appearance whenever the wax melts, the wax on said paper having a stable melting point equal to said predetermined high temperature.

4. The malfunction indicator of claim 1 wherein each of said connecting means includes receptacles for detachably receiving the respective terminals of said resistor.

5. The malfunction indicator of claim 1 for a power network wherein said parallel branch circuits are connected between a source terminal and a load terminal.

6. The malfunction indicator of claim 1 for a power network comprising complementary legs of a rectifier bridge wherein said parallel branch circuits are connected between a pair of relatively positive and negative load terminals and said intermediate points are respectively connected through electric current limiting fuses to one phase of the alternating voltage source.

7. The malfunction indicator of claim 1 for a power network wherein each of said branch circuits comprises at least first and second duplicate capacitors respectively connected across said first and second rectifier cells, and wherein a failure of any one of said capacitors results in appreciable potential difference between said intermediate points.

8. In a malfunction indicator for an electric power rectifier bridge having a plurality of legs connected between an a-c source and a d-c load, each of said legs including at least first and second branch circuits connected in parallel relationship with one another, each of said branch circuits comprising at least first and second semiconductor power rectifier cells serially interconnected in polarity agreement, the improvement comprising:

a. a plurality of indicating devices each including a cylindrical body, terminals at opposite ends of said body, a resistive element of relatively high ohmic value connected between said terminals, and heat sensitive material attached to the exterior of said cylindrical body for visually indicating that an appreciable amount of electric current has been conducted by said resistive element, said material being characterized by a noticeable and irreversible change in appearance whenever it is heated to a predetermined high temperature as a result of heat generated in the associated resistive element when conducting appreciable current;

b. first means for respectively connecting the terminals of a first one of said indicating devices to normally equipotential points intermediate said first and second cells of both of the first and second branch circuits of a first one of said legs; and c. second means for respectively connecting the terminals of a second one of said indicating devices to normally equipotential points intermediate said first and second cells of both of the first and second branch circuits of another leg of the rectifier bridge;

whereby during normal balanced operation there is negligible current in the resistive elements of said indicating devices but upon the failure of any one of said cells in a shorted mode the resulting potential difference between the intermediate points of the affected branch circuit and of the companion branch circuit in the same leg will cause the resistive element of the associated device to conduct sufficient current to heat the heat sensitive material of that device to said predetermined high temperature.

9. The malfunction indicator of claim 8 wherein said first one of the indicating devices is disposed in close physical proximity to the first and second branch circuits of said first one of said legs and said second one of the indicating devices is disposed in close physical proximity to the first and second branch circuits of said other leg.

10. The malfunction indicator of claim 8 for a rectifier bridge wherein each of said legs includes at least a third branch circuit, and wherein the malfunction indicator further comprises third means for respectively connecting the terminals of a third one of said indicating devices to normally equipotential points intermediate said first and second cells of both of the second and third branch circuits of said first one of said legs and fourth means for respectively connecting the terminals of a fourth one of said indicating devices to normally equipotential points intermediate said first and second cells of both of the second and third branch circuits of said other leg.

* * * * *